United States Patent
Taylor

(10) Patent No.: US 8,883,029 B2
(45) Date of Patent: Nov. 11, 2014

(54) METHOD OF MAKING A GAS DISTRIBUTION MEMBER FOR A PLASMA PROCESSING CHAMBER

(71) Applicant: Lam Research Corporation, Fremont, CA (US)

(72) Inventor: Travis Robert Taylor, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 89 days.

(21) Appl. No.: 13/766,096

(22) Filed: Feb. 13, 2013

(65) Prior Publication Data

US 2014/0227866 A1    Aug. 14, 2014

(51) Int. Cl.
| | |
|---|---|
| B44C 1/22 | (2006.01) |
| C23F 1/00 | (2006.01) |
| C23F 3/00 | (2006.01) |
| B05D 5/00 | (2006.01) |
| H01L 21/67 | (2006.01) |

(52) U.S. Cl.
CPC ............ B05D 5/00 (2013.01); H01L 21/6715 (2013.01); H01L 21/67069 (2013.01)
USPC .......................................... 216/81; 438/706

(58) Field of Classification Search
USPC ............................................ 216/81; 438/706
See application file for complete search history.

(56) References Cited

U.S. PATENT DOCUMENTS

| | | |
|---|---|---|
| 6,073,577 A | 6/2000 | Lilleland et al. |
| 6,194,322 B1 | 2/2001 | Lilleland et al. |
| 7,267,741 B2 | 9/2007 | Ren |
| 7,480,974 B2 | 1/2009 | Steger |
| 7,712,434 B2 | 5/2010 | Dhindsa et al. |
| 8,161,906 B2 | 4/2012 | Kadkhodayan et al. |
| 8,221,582 B2 | 7/2012 | Patrick et al. |
| 2005/0106884 A1* | 5/2005 | Ren .............................. 438/706 |
| 2012/0045902 A1 | 2/2012 | Fischer et al. |
| 2012/0175062 A1 | 7/2012 | de la Llera et al. |

* cited by examiner

Primary Examiner — Roberts Culbert
(74) Attorney, Agent, or Firm — Buchanan Ingersoll & Rooney PC

(57) ABSTRACT

A method of making a Si containing gas distribution member for a semiconductor plasma processing chamber comprises forming a carbon member into an internal cavity structure of the Si containing gas distribution member. The method includes depositing Si containing material on the formed carbon member such that the Si containing material forms a shell around the formed carbon member. The Si containing shell is machined into the structure of the Si containing gas distribution member wherein the machining forms gas inlet and outlet holes exposing a portion of the formed carbon member in an interior region of the Si containing gas distribution member. The method includes removing the formed carbon member from the interior region of the Si containing gas distribution member with a gas that reacts with carbon, dissociating the carbon atoms, which may thereby be removed from the interior region of the Si containing gas distribution member leaving a shaped internal cavity in the interior region of the Si containing gas distribution member.

15 Claims, 3 Drawing Sheets

US 8,883,029 B2

METHOD OF MAKING A GAS DISTRIBUTION MEMBER FOR A PLASMA PROCESSING CHAMBER

FIELD OF THE INVENTION

The invention relates to plasma processing apparatuses and more specifically to a method of making a gas distribution member for a plasma processing chamber.

BACKGROUND

Plasma processing apparatuses for processing semiconductor substrates, such as semiconductor wafers, can include one or more gas distribution members through which gas is flowed into a plasma processing chamber. For example, the gas distribution member can be a component of a showerhead electrode assembly positioned in the chamber to distribute process gas over a surface of a semiconductor substrate being processed in the chamber. Current gas distribution members are constructed from brazing two aluminum surfaces together and anodizing the aluminum surfaces, however, overflow of the brazing material is susceptible to corrosion when using halogen gases which may lead to contamination of semiconductor wafers during processing. Therefore a corrosion resistant gas distribution member is desired.

SUMMARY

Disclosed herein is a method of making a silicon (Si) containing gas distribution member which supplies process gas into a semiconductor plasma processing chamber. The method comprises forming a carbon member into a form corresponding to an internal cavity structure of the Si containing gas distribution member, and depositing Si containing material on the formed carbon member such that the Si containing material forms a shell of a predetermined thickness around the formed carbon member. Then, machining the Si containing shell into the structure of the Si containing gas distribution member wherein the machining forms gas inlet and outlet holes exposing a portion of the formed carbon member in an interior region of the Si containing gas distribution member, and removing the formed carbon member from the interior region of the Si containing gas distribution member with a gas that reacts with carbon, dissociating the carbon atoms, which may thereby be removed from the interior region of the Si containing gas distribution member leaving a shaped internal cavity in the interior region of the Si containing gas distribution member.

BRIEF DESCRIPTION OF THE DRAWING FIGURES

DETAILED DESCRIPTION

Figure 1:
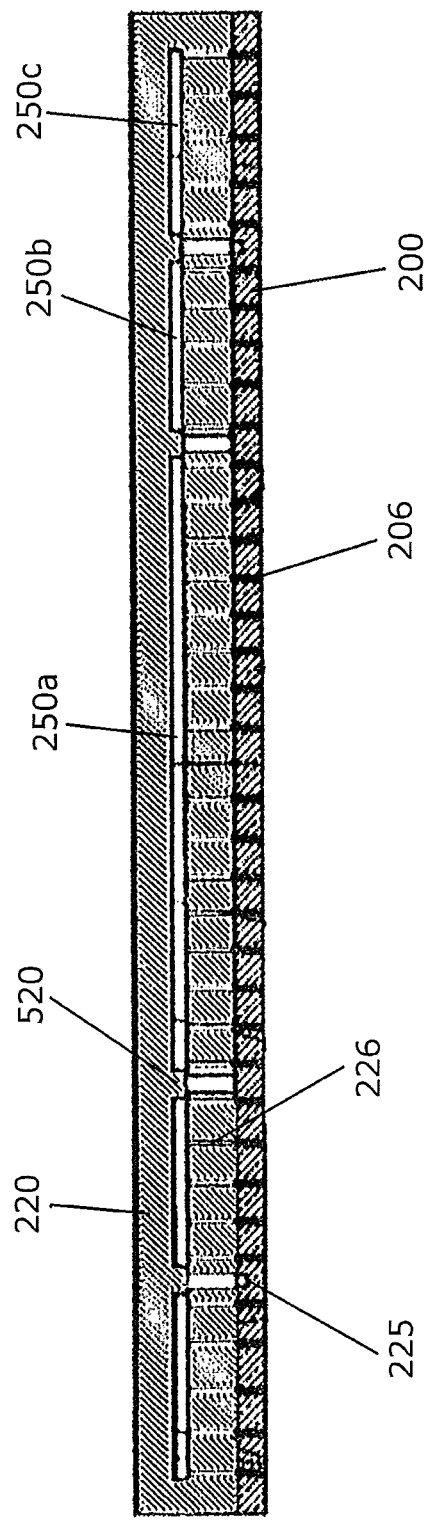
FIG. 1 illustrates a cross section of a SiC backing member which may be made in accordance with embodiments disclosed herein.

Disclosed herein is a method of making a Si containing gas distribution member, such as a SiC gas distribution member, with an internal cavity structure for supplying process gas to an interior of a plasma processing chamber. As used herein, Si containing means a material which includes Si. For example, the material can be high purity Si, silicon carbide (SiC), or silicon oxide. Plasma processing chambers can include one or more gas distribution members such as a gas distribution plate, backing plate, or the like. One exemplary type of plasma processing apparatus is a capacitively coupled plasma processing chamber. A capacitively coupled plasma processing chamber comprises a vacuum chamber including a top electrode and a substrate support on which a substrate, such as a semiconductor wafer, is supported during plasma processing. The substrate support includes a bottom electrode and a clamping mechanism, e.g., a mechanical chuck or an electrostatic chuck (ESC), for clamping the substrate. The top electrode (showerhead electrode) can be part of a showerhead electrode assembly for distributing process gas to the interior of the vacuum chamber. The showerhead electrode assembly can include one or more gas distribution members, such as the gas distribution plate, the backing member, the thermal control plate, and/or one or more vertically-spaced baffle rings below the backing member and above the showerhead electrode which control the supply of process gas to the vacuum chamber.

Preferably, the one or more gas distribution members are made of a material containing Si, are thermally conductive, electrically conductive, and corrosion and erosion resistant. In order to provide thermally and electrically conductive gas distribution members, such members are preferably made of silicon carbide ("SiC"), and more preferably the Si containing gas distribution members are made of CVD SiC. Alternatively the thermally and electrically conductive Si containing gas distribution members may be made from plasma enhanced chemical vapor deposition (PECVD) or cold spraying. Advantages of the CVD SiC include high thermal conductivity (e.g., CVD SiC has about twice as much thermal conductivity as sintered SiC) and tailored electrical resistivity (e.g., resistivity of SiC can be varied from electrically conducting to semiconducting). Another advantage of using CVD SiC for a gas distribution member is that it is possible to obtain a highly uniform temperature distribution across the surface of the member inside the vacuum chamber. In the case of processing wherein the member is maintained at a high enough temperature to minimize polymer buildup on the exposed surfaces of the member, the use of CVD SiC is advantageous from the standpoint of temperature control and minimizing particle generation. Furthermore, selecting SiC as the material of the gas distribution member allows the member to be highly resistant to chemical sputtering (sputtered SiC forming Si and C which may not affect device performance) and etching in environments that may contain oxygen, halogens, and/or hydro-fluorocarbon gas plasma in order to avoid corrosion and/or breakdown, and resultant particle generation associated therewith.

The Si containing gas distribution member, such as a SiC gas distribution member, may be exposed to corrosive halogen gases during processing wherein the corrosive halogen gases travel therethrough before being energized into plasma in the interior of the plasma processing chamber. Additionally, one or more Si containing gas distribution members can be used to control the spatial distribution of process gas flow in the volume of the vacuum chamber above the plane of the substrate. For example, the Si containing gas distribution member can be a SiC backing plate which contains an internal cavity structure, such as one or more gas plenums, and an array of gas inlet and outlet holes of specified diameters which extend axially between the internal cavity structure (i.e. gas plenums) and inlet or outlet surfaces of the SiC backing plate wherein the pattern of gas outlet holes in the SiC backing plate are aligned with the pattern of gas injection holes in an underlying showerhead electrode. The spatial distribution of aligned gas outlets in the SiC backing plate with the gas injection holes in the showerhead electrode may be varied to optimize etch uniformity of the layers to be etched, e.g., a photoresist layer, a silicon dioxide layer and an underlayer material on the wafer.

FIG. 1 illustrates an embodiment of a showerhead electrode assembly comprising a Si containing gas distribution member and a showerhead electrode 200, wherein the Si containing gas distribution member forms a SiC backing member 220, including an internal cavity structure, located on the backside of the showerhead electrode 200. The SiC backing member 220 is preferably part of a showerhead electrode assembly such as a cam-locked showerhead electrode assembly which is described in commonly-assigned U.S. Patent Application 2012/0175062, which is hereby incorporated by reference in its entirety.

The SiC backing member 220 can be fastened with cam locks or contact bolts 225 to the showerhead electrode 200 or alternatively attached to a backside of the showerhead electrode 200 by elastomer bonding (for example, see commonly-assigned U.S. Pat. Nos. 6,194,322 B1 and 6,073,577, which are hereby incorporated by reference in their entirety). The SiC backing member 220 includes gas outlet holes 226 aligned with gas passages 206 in the showerhead electrode 200 to provide gas flow therethrough.

Preferably, the SiC backing member 220 includes one or more plenums to direct gas through the gas outlet holes 226 at the backside of the showerhead electrode 200. For example, a central plenum may be surrounded by an annular plenum within the backing member 220 such that the spatial distribution of process gas flow in the volume of the vacuum chamber above an underlying substrate may be controlled so a gas flow directed to a center region of the underlying substrate may be controlled independently from a gas flow directed towards an outer (edge) region of the underlying substrate. As illustrated in FIG. 1, a central plenum 250a is surrounded by two fluidly isolated annular plenums 250b,c to form the internal cavity structure of the backing member 220. The plenums are separated by integral walls 520 in the SiC backing member 220, wherein the integral walls 520 may form concentric rings which define isolated gas zones in the internal cavity structure of the SiC backing member 220. However, in alternate embodiments, channels can be provided in the integral walls 520 such that the channels allow for gaseous communication between two or more plenums formed in the SiC backing member 220.

Figure 2:
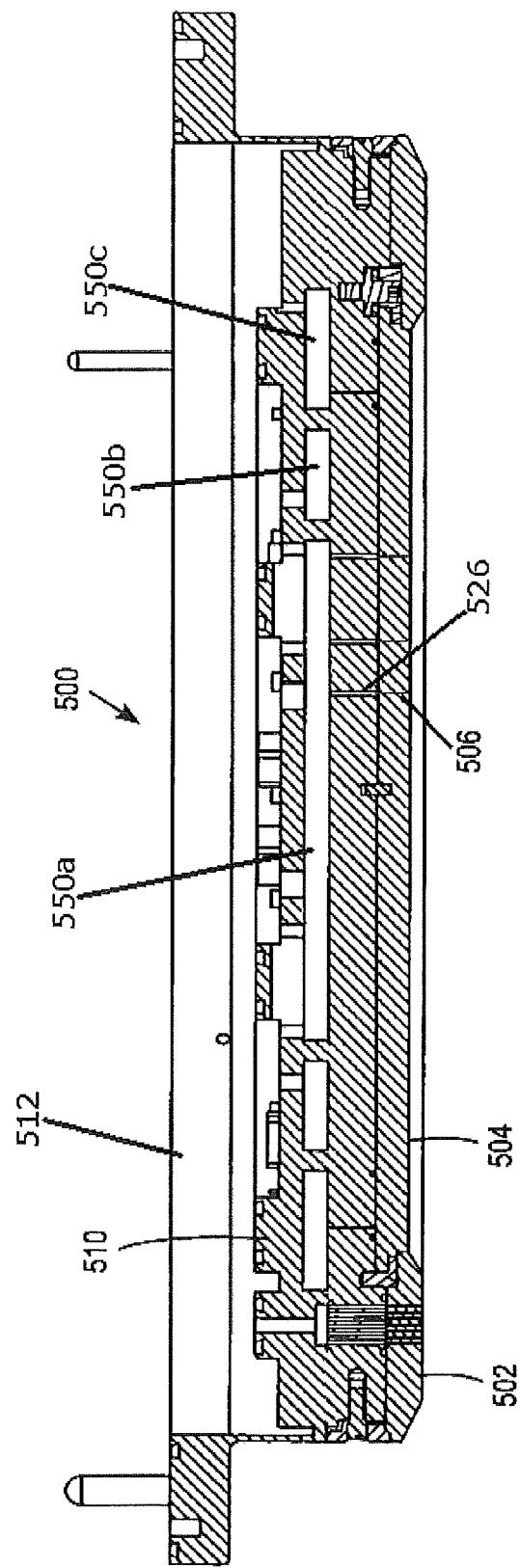
FIG. 2 illustrates a cross section of a SiC thermal control plate which may be made in accordance with embodiments disclosed herein.

In an alternate embodiment disclosed herein, a Si containing gas distribution member is a thermal control plate installed in showerhead electrode assembly of a plasma processing chamber such as a capacitively coupled plasma chamber used for plasma etching semiconductor substrates. FIG. 2 is a cross-section of an upper electrode assembly 500 for a capacitively coupled plasma chamber including a Si containing gas distribution member wherein the Si containing gas distribution member forms a thermal control plate 510 including an internal cavity structure. The thermal control plate 510 is preferably made of SiC. The internal cavity structure of the SiC thermal control plate 510 forms plenums to direct process gas through gas outlet holes 526 in a lower surface of the SiC thermal control plate 510 through aligned gas passages 506 in the showerhead electrode leading into the plasma chamber. A central plenum 550a, which may be disk shaped, is surrounded by a first outer annular plenum 550b and a second outer annular plenum 550c. The central plenum 550a and the first and second outer annular plenums 550b,c are separated by integral walls 520. The integral walls 520 separating plenums 550a,b,c in the SiC thermal control plate 510 may form concentric rings which define isolated gas zones in the internal cavity structure of the SiC thermal control plate 510. However, in alternate embodiments, channels can be provided in the integral walls 520 such that the channels allow for gaseous communication between two or more plenums formed in the SiC thermal control plate 510.

Figure 3:
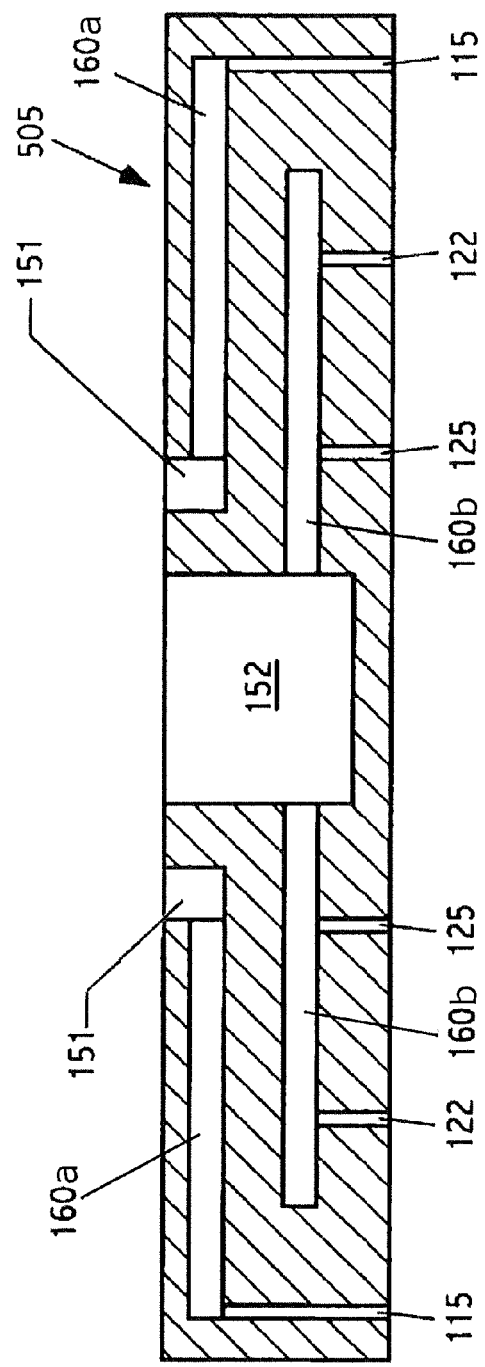
FIG. 3 illustrates an exemplary embodiment of a Si containing gas distribution member which may be made in accordance with embodiments disclosed herein.

FIG. 3 illustrates an alternate embodiment of a Si containing gas distribution member, wherein the Si containing gas distribution member forms a radially or laterally extending cylindrical SiC gas distribution plate 505 including an internal cavity structure formed by radially extending plenums. The internal cavity structure preferably forms multiple fluidly isolated radial gas plenums such as those formed by radial plenums 160a,b. The SiC gas distribution plate 505 may further include an annular distribution conduit 151 extending into its upper surface and axially extending gas outlets 115 wherein the distribution conduit 151 and the axially extending gas outlets 115 are in fluid communication with the radial plenums 160a. The SiC gas distribution plate 505 may also include a cylindrical blind bore 152 extending into its upper surface and axially extending gas outlets 122, 125 wherein the cylindrical bore 152 and the axially extending gas outlets 122, 125 are in fluid communication with radial plenums 160b. Using gas feeds (not shown), conduit 151, cylindrical bore 152, radial plenums 160a,b and gas outlets 115, 122, 125, the SiC gas distribution plate 505 may provide gas distribution to an optional backing member, or one or more plenums at the backside of a showerhead electrode (not shown). Thus, different process gas chemistries and/or flow rates can be applied to one or more zones across the substrate being processed. In an alternate embodiment, the annular plenums 160a,b may be receive gas from radial gas passages (not shown) such that the SiC gas distribution plate 505 is edge fed with a process gas.

Embodiments of methods of making the Si containing gas distribution member comprising an internal cavity structure are now discussed. First a shaping step is performed to a carbon member, preferably graphite, which undergoes shaping such that a corresponding form of the internal cavity structure of the Si containing gas distribution member is formed from the carbon member. Accordingly, a Si containing gas distribution member which has more than one gas plenum will require an independent carbon member corresponding to the internal cavity structure of each plenum to be shaped. In essence, the carbon member(s) are shaped such that they correspond to the form of the gas plenum(s) comprised in the Si containing gas distribution member. Forms may include annular or radial shaped structures intended to form the annular or radial gas plenums in the internal cavity structure of the Si containing gas distribution member. In preferred embodiments, fluidly isolated gas plenums are comprised in the Si containing gas distribution member. When more than one fluidly isolated gas plenum is desired, the carbon members are isolated from each other and are formed to correspond to fluidly isolated gas plenums in the Si containing gas distribution member. In a preferred embodiment, each isolated shaped carbon member is shaped such that it forms a respective independent gas plenum. Other embodiments of the Si containing gas distribution member may comprise independent gas plenums formed in alternate configurations, such as and not limited to radial gas plenums in communication with axially extending gas passages as illustrated in FIG. 3.

After the carbon member(s) have been formed into the corresponding internal cavity structure of the gas distribution member, a Si containing material depositing step is performed. The Si containing material can preferably be deposited on the formed carbon member(s) by a CVD process, and grown to a predetermined thickness forming a Si containing shell around the formed carbon member(s). Alternatively, the Si containing material may be deposited by a PECVD process or a cold spray process. Preferably, each formed carbon member is supported on a first side in a spatial configuration with respect to other formed carbon members. The spatial configuration is arranged to form the corresponding internal cavity structure of the gas distribution member. A second side of each formed carbon member is coated with Si containing material to form a CVD deposited Si containing shell. Then, the formed carbon members including the portion of the CVD deposited Si containing shell may be turned and supported on a portion of the CVD deposited Si containing shell on the second side of each formed carbon member such that CVD Si containing material may be deposited on remaining exposed surfaces of each formed carbon member. After the Si containing shell is formed, the Si containing gas distribution member may be machined into the structure of the gas distribution member during a machining step. The machining step comprises both machining the Si containing shell into the corresponding external structure of the Si containing gas distribution member as well as fabricating gas inlet and outlet holes. Machining gas inlet and outlet holes will preferably expose a portion of the formed carbon member(s) in the interior region of the Si containing gas distribution member. The formed carbon member(s) may then be removed from the interior region of the Si containing gas distribution member in a removing step. The removing step comprises reacting the carbon member(s) with a gas such that the carbon atoms of the carbon member(s) oxidize and may thereby be removed from the interior region of the Si containing gas distribution member. After the carbon member(s) have been removed, the Si containing gas distribution member will remain, wherein the interior region of the Si containing gas distribution member comprises the corresponding internal cavity structure.

The Si containing gas distribution member preferably comprises internal geometry such that an internal cavity structure is disposed in an interior region of the Si containing gas distribution member. In a preferred embodiment, the internal cavity structure is formed to comprise two isolated gas plenums inside of the Si containing gas distribution member such that each gas plenum may allow a differential radial distribution of process gases in the plasma chamber. It should be understood that in alternate preferred embodiments, a single gas plenum or three or more gas plenums may be formed. It is also preferable that each gas plenum be independent, i.e. fluidly isolated from other gas plenums in the Si containing gas distribution member.

The machining can be performed by any suitable technique such as grinding, lapping, honing, ultrasonic machining, water jet or abrasive jet machining, laser machining, electrical discharge machining, ion-beam machining, electron-beam machining, chemical machining, electrochemical machining, or the like. In a preferred embodiment, a mechanical hole fabrication technique, such as drilling, is used to form the gas inlet and outlet holes in the Si containing gas distribution member. In a more preferable embodiment, the mechanical hole fabrication technique is used to form the major portion of the total gas inlet and outlet holes in the Si containing gas distribution member, then, a more precise technique, e.g., laser drilling, is used to adjust the permeability of the gas inlet and outlet holes in the Si containing gas distribution member. In a preferred embodiment of the method, the outer surface of the Si containing gas distribution member can be machined, such as by grinding and/or polishing, to achieve a desired surface finish prior to and/or after the removal of the carbon member.

Other exemplary Si containing gas distribution member machining techniques which can be used are described in commonly-assigned U.S. Pat. No. 7,480,974, which is incorporated herein by reference in its entirety.

The formed carbon member or members, such as graphite member(s), in the interior region of the Si containing gas distribution member can be removed by heating the Si containing gas distribution member with exposed carbon surfaces in any suitable vessel, such as a high-temperature oven or furnace. The vessel preferably has an oxygen-containing atmosphere which can include, but is not limited to, $O_2$, air, water vapor, or a mixture thereof. In a preferred embodiment, the vessel is sealed and the oxygen-containing atmosphere, such as air, is supplied into the vessel via a gas supply system. The Si containing gas distribution member may be maintained at atmospheric pressure within the vessel, or alternatively the pressure within the vessel may be lowered to sub-atmospheric pressures.

As a result of heating the Si containing gas distribution member with the atmosphere exposed carbon member(s) in the presence of oxygen, the formed carbon member(s) may be chemically removed from the interior of the Si containing shell by converting the carbon to carbon dioxide ($CO_2$) gas and/or carbon monoxide (CO) gas. In essence, the oxygen reactions with the carbon in a combustion reaction that causes the carbon to burn. In an alternate embodiment, the SiC gas distribution member comprising the formed carbon member(s) may be heated in the presence of hydrogen, wherein the formed carbon member(s) may be converted to methane ($CH_4$) gas. Hence the formed carbon member(s) may be converted from solid to gas, and thereby be evacuated from the interior region of the Si containing gas distribution member. In an alternate embodiment, the formed carbon member(s) may be converted from solid to liquid, and thereby removed from the interior region of the Si containing gas distribution member.

The oxygen-containing atmosphere is preferably maintained at a temperature that is effective to oxidize the carbon atoms of the carbon member(s) (i.e., convert the carbon member to CO, $CO_2$ or mixtures thereof), but is sufficiently low to substantially avoid oxidizing the Si containing material, such as SiC (i.e., adversely affecting mechanical and/or physical properties of the Si containing material.) Preferably, the temperature of the oxygen-containing atmosphere in the treatment vessel is from about 600° C. to about 1200° C., and more preferably from about 800° C. to about 900° C. The Si containing gas distribution members are treated in the oxygen-containing atmosphere for an amount of time that is effective to remove all or at least substantially all of the carbon from the interior region of the Si containing gas distribution member, such as a SiC gas distribution member, preferably from about 2 hours to about 12 hours.

Another preferred method of removing the formed carbon member(s), such as formed graphite member(s), from the interior region of the Si containing gas distribution member comprises treating the member with an oxygen plasma to remove all or substantially all of the carbon from the interior region. For example, a SiC gas distribution member can be treated in an ashing chamber of a semiconductor substrate processing apparatus to remove the formed carbon member (s). The temperature of the SiC gas distribution member comprising the formed carbon member(s) in an interior region can range, for example, from about 200° C. to about 300° C. during the removal step. In some embodiments, the plasma ashing process may be performed at sub-atmospheric pressures. In some embodiments, the pressure may be about 100 mbar or less.

While embodiments disclosed herein have been described in detail with reference to specific embodiments thereof, it will be apparent to those skilled in the art that various changes and modifications can be made, and equivalents employed, without departing from the scope of the appended claims.

What is claimed is:

1. A method of making a Si containing gas distribution member which supplies process gas into a semiconductor plasma processing chamber comprising:

forming a carbon member into a form corresponding to an internal cavity structure of the Si containing gas distribution member;

depositing a Si containing material on the formed carbon member such that the Si containing material forms a shell of a predetermined thickness around the formed carbon member;

machining the Si containing shell into the structure of the Si containing gas distribution member wherein the machining forms gas inlet and outlet holes exposing a portion of the formed carbon member in an interior region of the Si containing gas distribution member; and removing the formed carbon member from the interior region of the Si containing gas distribution member with a gas that reacts with carbon, dissociating the carbon atoms, which may thereby be removed from the interior region of the Si containing gas distribution member leaving a shaped internal cavity in the interior region of the Si containing gas distribution member.

2. The method of claim 1, wherein depositing Si containing material on the formed carbon member includes supporting the formed carbon member on a first side of the formed carbon member and depositing Si containing material on a second side of the formed carbon member, turning the formed carbon member, and then supporting the deposited Si containing material on the second side of the formed carbon member and depositing Si containing material on the first side of the formed carbon member.

3. The method of claim 1, wherein the formed carbon member comprises multiple disconnected carbon elements which are formed and arranged in a spatial relationship corresponding to the internal cavity structure of the Si containing gas distribution member, the multiple disconnected carbon elements being arranged such that they may form more than one fluidly isolated gas zones in the Si containing gas distribution member wherein depositing Si containing material on the formed and arranged carbon elements comprises supporting each carbon element on a first side and depositing Si containing material on each second side of the formed and arranged carbon elements forming a portion of the Si containing shell on the second sides of the formed and arranged carbon elements, turning the formed and arranged carbon elements, and then supporting the portion of the Si containing shell on the second sides of the formed and arranged carbon elements and depositing Si containing material on each first side of the formed and arranged carbon elements forming the Si containing shell on the formed and arranged carbon elements.

4. The method of claim 3, wherein the fluidly isolated gas zones inside of the Si containing gas distribution member are arranged such that each fluidly isolated gas zone may allow a different radial or annular distribution of process gases.

5. The method of claim 3, wherein two disconnected carbon elements are formed into the corresponding form of an internal cavity having two fluidly isolated gas plenums inside of the Si containing gas distribution member.

6. The method of claim 1, wherein the Si containing material depositing step is performed by a CVD process, a PECVD process, or a cold spray process.

7. The method of claim 1, wherein the removal of the formed carbon member comprises an ashing process.

8. The method of claim 1, wherein the removal of the formed carbon member comprises heating the Si containing coated carbon member in an oxygen-containing atmosphere to remove the carbon from the interior region of the Si containing gas distribution member.

9. The method of claim 1, wherein the removal of the carbon member comprises heating the Si containing coated carbon member in a hydrogen-containing atmosphere to remove the carbon from the interior region of the Si containing gas distribution member.

10. The method of claim 1, wherein each gas inlet and outlet hole is fabricated by a mechanical fabrication technique such as drilling.

11. The method of claim 10, wherein each gas inlet and outlet hole is further laser drilled to adjust the permeability of each gas inlet and outlet hole to a predetermined permeability.

12. The method of claim 1, wherein the semiconductor plasma processing chamber is a plasma etch chamber.

13. The method of claim 1, wherein the Si containing gas distribution member is a backing plate, thermal control plate, or gas distribution plate.

14. The method of claim 1, wherein the formed carbon member is formed from graphite.

15. The method of claim 1, wherein the Si containing material is SiC.

* * * * *